(12) United States Patent
Huang et al.

(10) Patent No.: US 11,362,226 B1
(45) Date of Patent: Jun. 14, 2022

(54) SOLAR CELL STRING, PHOTOVOLTAIC MODULE AND MANUFACTURING METHODS THEREFOR

(71) Applicants: ZHEJIANG JINKO SOLAR CO., LTD., Zhejiang (CN); JINKO SOLAR CO., LTD., Jiangxi (CN)

(72) Inventors: Shiliang Huang, Zhejiang (CN); Zhiqiu Guo, Zhejiang (CN); Jiaming Zhu, Zhejiang (CN); Guohui Hao, Zhejiang (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 17/322,885

(22) Filed: May 17, 2021

(30) Foreign Application Priority Data

Mar. 5, 2021  (CN) .......................... 202110246919.9

(51) Int. Cl.
  *H01L 31/05* (2014.01)
  *H01L 31/048* (2014.01)
(52) U.S. Cl.
  CPC ...... *H01L 31/0504* (2013.01); *H01L 31/0481* (2013.01); *H01L 31/0512* (2013.01)
(58) Field of Classification Search
  CPC ............. H01L 31/0504; H01L 31/0481; H01L 31/0512
  See application file for complete search history.

(56) References Cited

U.S. PATENT DOCUMENTS

| 4,019,924 | A | * | 4/1977 | Kurth | .................. H01L 31/0512 |
|---|---|---|---|---|---|
|  |  |  |  |  | 136/251 |
| 5,391,235 | A | * | 2/1995 | Inoue | ................ H01L 31/03921 |
|  |  |  |  |  | 136/244 |

(Continued)

FOREIGN PATENT DOCUMENTS

| CN | 100431175 C | 11/2008 |
|---|---|---|
| CN | 110521006 A | 11/2019 |

(Continued)

OTHER PUBLICATIONS

Zhejiang Jinko Solar Co., Ltd. et al., JP First Office Action, JP 2021-082072, Jul. 12, 2021, 4pgs.

(Continued)

*Primary Examiner* — Golam Mowla
(74) *Attorney, Agent, or Firm* — USCH Law, PC

(57) ABSTRACT

A method for manufacturing a solar cell string includes: providing a first adhesive layer, wherein the first adhesive layer includes N placement regions being used for N solar cells respectively; placing the N solar cells on the placement regions; laying first wires on a surface of at least one solar cell away from the first adhesive layer, and stretching the first wires across adjacent placement regions to electrically connect two adjacent solar cells; disposing a second adhesive layer on the surface of the at least one solar cell of the N solar cells away from the first adhesive layer, wherein the first wires are located between the second adhesive layer and the at least one solar cell; performing a pressing treatment to bond and fix the first adhesive layer, the first wires, the at least one solar cell of the N solar cells and the second adhesive layer.

12 Claims, 5 Drawing Sheets

(56) References Cited

U.S. PATENT DOCUMENTS

| | | | |
|---|---|---|---|
| 9,935,227 B2* | 4/2018 | Yoshimine | H01L 31/0508 |
| 2004/0200522 A1* | 10/2004 | Fukawa | H01L 31/022425 |
| | | | 136/259 |
| 2005/0199279 A1* | 9/2005 | Yoshimine | H01L 31/048 |
| | | | 257/E27.125 |
| 2007/0235077 A1* | 10/2007 | Nagata | B32B 17/10788 |
| | | | 136/256 |
| 2010/0018563 A1* | 1/2010 | Yoshimine | H01L 31/0747 |
| | | | 136/244 |
| 2010/0108141 A1* | 5/2010 | Fukushima | H01L 31/186 |
| | | | 174/126.1 |
| 2010/0116314 A1* | 5/2010 | Fukushima | C09J 11/04 |
| | | | 174/126.1 |
| 2010/0147355 A1* | 6/2010 | Shimizu | H01L 31/02008 |
| | | | 29/874 |
| 2010/0240153 A1* | 9/2010 | Tabe | H01L 31/188 |
| | | | 438/4 |
| 2012/0012153 A1* | 1/2012 | Azechi | H01L 31/02021 |
| | | | 257/E31.124 |
| 2012/0103385 A1* | 5/2012 | Hong | H01L 31/05 |
| | | | 257/E31.124 |
| 2012/0240985 A1* | 9/2012 | Hashimoto | H01L 31/0508 |
| | | | 136/251 |
| 2013/0112239 A1* | 5/2013 | Liptac | H01L 31/0201 |
| | | | 136/246 |
| 2013/0167910 A1 | 7/2013 | DeGroot et al. | |
| 2016/0111574 A1* | 4/2016 | Yoshimine | H01L 31/0508 |
| | | | 136/244 |
| 2018/0212073 A1 | 7/2018 | Zhang et al. | |

FOREIGN PATENT DOCUMENTS

| | | |
|---|---|---|
| CN | 111201615 A | 5/2020 |
| CN | 210692545 U | 6/2020 |
| CN | 210897315 U | 6/2020 |
| CN | 112201720 A | 1/2021 |
| EP | 2657982 A1 | 10/2013 |
| JP | 2011132295 A | 7/2011 |
| JP | 2011166075 A | 8/2011 |
| JP | 4986462 B2 | 7/2012 |
| JP | 2012243761 A | 12/2012 |
| JP | 2015065303 A | 4/2015 |
| JP | 2016058606 A | 4/2016 |
| WO | 2016204192 A1 | 12/2016 |
| WO | 2018142544 A1 | 8/2018 |

OTHER PUBLICATIONS

Zhejiang Jinko Solar Co., Ltd., et al., Extended European Search Report, EP 21173963.6, Oct. 28, 2021, 34 pgs.

* cited by examiner

SOLAR CELL STRING, PHOTOVOLTAIC MODULE AND MANUFACTURING METHODS THEREFOR

CROSS-REFERENCE TO RELATED APPLICATION

The present application claims the benefit of priority to Chinese Patent Application No. 202110246919.9 filed on Mar. 5, 2021, which is incorporated herein by reference in its entirety.

TECHNICAL FIELD

Embodiments of the present disclosure relate to the photovoltaic field, in particular to a solar cell string, a photovoltaic module and manufacturing methods therefor.

BACKGROUND

As the issues of energy shortages and environment deterioration become increasingly serious, solar energy has received more and more attention as a green and renewable energy source. The photovoltaic module is a device that converts renewable solar energy into electrical energy.

The photovoltaic module is usually composed of multiple solar cell strings, and the solar cell string is usually composed of multiple solar cells connected in series. The process of connecting multiple solar cells in series to form a solar cell string is called as a solar cell interconnection process. The performance of the photovoltaic module is related to the development of the solar cell interconnection process.

However, it is still desired to improve the current solar cell interconnection process, as well as the performance of the photovoltaic module.

SUMMARY

Some embodiments of the present disclosure provide a solar cell string, a photovoltaic module and manufacturing methods therefor, so as to optimize the solar cell interconnection process, thereby improving the performance of the photovoltaic module.

Some embodiments of the present disclosure provide a method for manufacturing a solar cell string, wherein the solar cell string includes N solar cells sequentially arranged along a first direction and connected in series, and the method includes: providing a first adhesive layer, wherein the first adhesive layer includes N placement regions along the first direction, each of the placement regions is used to bond and fix a corresponding solar cell of the N solar cells, and the N is a positive integer greater than 1; placing the N solar cells on the placement regions; laying first wires on a surface of at least one solar cell of the N solar cells away from the first adhesive layer, and stretching the first wires across adjacent placement regions to electrically connect two adjacent solar cells; disposing a second adhesive layer on the surface of the at least one solar cell of the N solar cells away from the first adhesive layer, wherein the first wires are located between the second adhesive layer and the at least one solar cell; performing a pressing treatment to bond and fix the first adhesive layer, the first wires, the at least one solar cell of the N solar cells and the second adhesive layer.

In some embodiments, the pressing treatment includes at least one of: a heating treatment, wherein the first adhesive layer includes a hot melt adhesive, and the second adhesive layer includes a hot melt adhesive; and an ultraviolet irradiation treatment, wherein the first adhesive layer includes a UV curable adhesive, and the second adhesive layer includes a UV curable adhesive.

In some embodiments, light-receiving surfaces of the N solar cells face a same direction, and each of the first wires includes a light-receiving wire, a connecting wire and a rear wire that are sequentially connected; the laying the first wires includes: laying light-receiving wires on the light-receiving surface of one of the N solar cells, wherein the light-receiving surface is away (i.e., facing away) from the first adhesive layer; bending connecting wires so that the rear wires are located on a surface of the first adhesive layer of an adjacent placement region.

In some embodiments, the light-receiving wires are dense grid lines, the light-receiving surface of each of the N solar cells is provided with subgrid lines arranged at intervals, and the subgrid lines intersect and contact with the dense grid lines; and the method further includes: disposing the second adhesive layer on surfaces of the subgrid lines.

In some embodiments, 8 to 32 light-receiving wires are laid at intervals on the light-receiving surface of each of the N solar cells.

In some embodiments, light-receiving surfaces of adjacent solar cells face opposite directions; the method further includes: laying second wires on the surface of the first adhesive layer of the N placement regions before placing the N solar cells on the N placement regions, and stretching the second wires across adjacent placement regions to electrically connect adjacent solar cells.

In some embodiments, the solar cell string includes a first solar cell at a head portion of the solar cell string and an Nth solar cell at a tail portion of the solar cell string respectively; the method further includes: laying head wires on the first adhesive layer before placing the first solar cell, wherein the head wires are located between the first adhesive layer and the first solar cell, and the head wires extend outside the first solar cell; laying tail wires on a surface of the Nth solar cell away from the first adhesive layer and extending the tail wires outside the Nth solar cell after placing the Nth solar cell, and disposing the second adhesive layer on the surface of the Nth solar cell away from the first adhesive layer; providing at least two bus bars, wherein one of the bus bars is contacted and connected with the head wires extending outside the first solar cell, and the other bus bar is contacted and connected with the tail wires extending outside the Nth solar cell; and extend directions of the two bus bars are both different from the first direction.

Some embodiments of the present disclosure further provide a method for manufacturing a photovoltaic module, including: providing a solar cell string, wherein the solar cell string is manufactured by any of the above methods; stacking a first substrate, a first encapsulating layer, the solar cell string, a second encapsulating layer, and a second substrate to form a stacked structure; performing a lamination treatment on the stacked structure, wherein the first wires are electrically connected with the solar cells during the lamination treatment.

In some embodiments, a process temperature used in the lamination treatment is greater than or equal to a melting point temperature of the first wire.

In some embodiments, the first wire includes a solder core and an alloy layer surrounding the solder core, and the process temperature used in the lamination treatment is greater than a melting point temperature of the alloy layer.

In some embodiments, a difference between the process temperature of the lamination treatment and the melting point temperature is less than or equal to 30° C.

In some embodiments, a process pressure used in the lamination treatment is −50 kPa to 200 kPa.

In some embodiments, the melting point temperature is 100° C. to 160° C.

Some embodiments of the present disclosure further provide a solar cell string, including: a first adhesive layer, wherein the first adhesive layer includes N placement regions sequentially arranged along a first direction, and the N is a positive integer greater than 1; N solar cells, wherein each of the N solar cells is disposed on a corresponding placement region of the N placement regions; first wires, wherein the first wires are laid on a surface of at least one of the N solar cells away from the first adhesive layer, and the first wires stretch across adjacent placement regions to electrically connect adjacent solar cells; a second adhesive layer, wherein the second adhesive layer is disposed on the surface of at least one of the N solar cells away from the first adhesive layer, the first wires are located between the second adhesive layer and the at least one of the N solar cells, and the first adhesive layer, the first wires, the N solar cells, and the second adhesive layer are bonded and fixed.

In some embodiments, the solar cell string includes a first solar cell at a head portion of the solar cell string and an Nth solar cell at a tail portion of the solar cell string respectively; the solar cell string further includes: head wires, wherein the head wires are located between the first adhesive layer and the first solar cell and extend outside the first solar cell; tail wires, wherein the tail wires are located on a surface of the Nth solar cell away from the first adhesive layer, and extend outside the Nth solar cell; and the second adhesive layer is disposed on the surface of the Nth solar cell away from the first adhesive layer; at least two bus bars, wherein one of the bus bars is contacted and connected with the head wire extending outside the first solar cell, and the other bus bar is contacted and connected with the tail wire extending outside the Nth solar cell; and extend directions of the two bus bars are both different from the first direction.

In some embodiments, in the first direction, an absolute value of a difference between a total length of the N solar cells and a length of the first adhesive layer is less than or equal to 100 mm.

In some embodiments, in the first direction, an absolute value of a difference between a length of the second adhesive layer and a total length of the N solar cells is less than or equal to 60 mm.

In some embodiments, the first adhesive layer includes a support layer and an adhesive layer, and the adhesive layer is located between the support layer and the N solar cells; the second adhesive layer is of a single-layer structure.

Some embodiment of the present disclosure further provide a photovoltaic module, including: a first substrate, a first encapsulating layer, any of the above solar cell strings, a second encapsulating layer, and a second substrate stacked.

In this way, the solar cells are directly electrically connected through the first wires, and the interconnection between the solar cells may be realized without a prefabricated flexible electrical connection layer, so there is no need to adopt the production equipment of flexible electrical connection layer. In addition, since there is no need to use the welding interconnection technology, the adverse effects of high welding temperature and welding stress on the solar cell string may be avoided. Furthermore, after the pressing treatment, the first adhesive layer and the second adhesive layer may bond the first wires, so that the first wires are fixed on the surface of the solar cells. Therefore, the performance of the solar cell string can be improved, the production process of the solar cell string can be simplified, and the production cost can be reduced.

Further, the light-receiving wire of the first wire is a dense grid wire, and 8 to 32 light-receiving wires are laid on the light-receiving surface of the solar cell. Due to the large number of light-receiving wires 131, the current transmission path in the solar cell 10 may be shortened, and the internal loss may be reduced, so as to further improve the performance of the solar cell string, thereby improving the performance of the photovoltaic module.

Further, the second adhesive layer is disposed on the light-receiving surface of the solar cell, and the second adhesive layer may be a single-layer structure, which is conductive to reducing the amount of light absorbed by the second adhesive layer, so as to ensure that more light is absorbed by the solar cell, improve the light utilization rate of the solar cell, thereby further optimizing the solar cell string and improving the performance of the photovoltaic module.

Further, since the lamination treatment is adopted to realize the electrical connection between the first wires and the solar cell, there is no need to use a welding interconnection technology, thereby avoiding the adverse effects of high welding temperature and welding stress on the solar cell string, reducing the welding stress of photovoltaic modules, and improving the performance of photovoltaic modules.

BRIEF DESCRIPTION OF THE DRAWINGS

One or more embodiments are exemplified by the figures in the corresponding drawings. These exemplified descriptions do not constitute a limitation on the embodiments. Unless otherwise stated, the figures do not constitute a scale limitation.

DETAILED DESCRIPTION

As noted, it is still desired to improve the current solar cell interconnection process, as well as the performance of the photovoltaic module.

The inventors found, for an interconnection process in which the solar cells are interconnected to form the photovoltaic module by welding a welding strip, the welding temperature is excessive high and the welding stress is excessive large.

Figure 1:
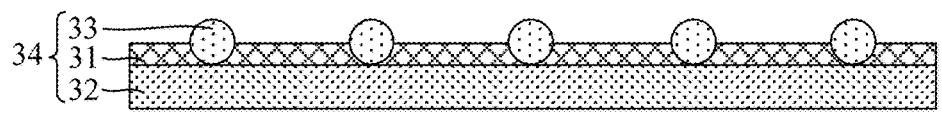
FIGS. 1 and 2 are schematic structural diagrams corresponding to each step in an interconnection technology.
Figure 2:
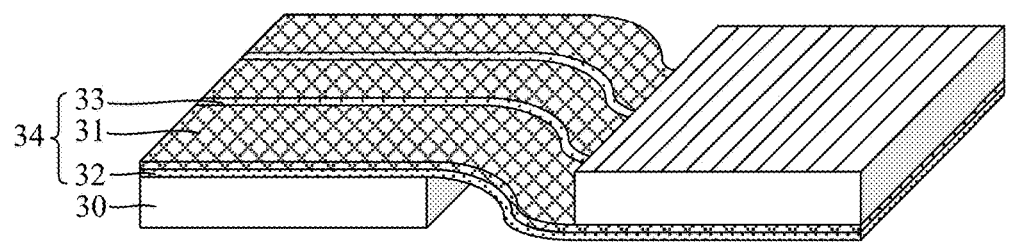

An interconnection technology, called as the Smart wire interconnection technology, has been developed, to avoid adverse effects of welding on photovoltaic modules. FIGS. 1 and 2 are schematic structural diagrams corresponding to each step in the Smart wire interconnection technology, and FIG. 1 is a cross-sectional view of a flexible electrical connection layer.

As shown in FIG. 1, the flexible electrical connection layer 34 is prefabricated. The flexible electrical connection layer 34 is prepared by a double-layer structured polymer film composed of an adhesive layer 31 and a support layer 32, and metal wires 33 through a hot pressing method.

During the preparation process of the flexible electrical connection layer 34, in order to prevent the adhesive layer 31 from sticking to production equipment, the support layer 32 is required to isolate the adhesive layer 31 from the production equipment. Therefore, the flexible electrical connection layer 34 has to be a double-layer structure. However, when the subsequent flexible electrical connection layer 34 is laid on a light-receiving surface of a solar cell, the double-layer structure would reduce the light absorption rate of the solar cell.

As shown in FIG. 2, after the flexible electrical connection layer 34 is cut into flexible electrical connection layer units, the solar cells 30 are connected in series one another. Subsequently, the solar cell string is processed by hot pressing or the like, and the flexible electrical connection layers 34 at a head portion and a tail portion of the solar cell string are specially processed, so that the metal wires 33 are exposed to facilitate subsequent connection with a bus bar to collect electrical current.

In the Smart wire interconnection technology, although the series welding is eliminated, steps for prefabricating the flexible electrical connection layer 34 and cutting the flexible electrical connection layer 34 are still required. In addition, the flexible electrical connection layers 34 at the head portion and the tail portion of the solar cell string need to be specially processed, which increases the complexity of the process and also cause a potential bottleneck in mass production. Further, due to the difference between the Smart wire interconnection technology and the conventional welding-interconnection technology, the original welding equipment may not meet the preparation requirements of the solar cell string under the Smart wire interconnection technology. Therefore, it is necessary to carry out the development of new equipment, such as the development of production equipment for flexible electrical connection layers. The development of new equipment has a risk of failure and may further increase production costs.

In order to solve the above problems, some embodiments of the present disclosure provide a method for manufacturing a solar cell string, including: providing a first adhesive layer, where each placement region of the first adhesive layer is used to bond and fix a corresponding solar cell; placing the solar cell on the placement region; laying first wires on a surface of at least one solar cell of the N solar cells away from the first adhesive layer, and stretching the first wires across adjacent placement regions to electrically connect two adjacent solar cells; disposing a second adhesive layer on the surface of the solar cell away from the first adhesive layer; performing a pressing treatment to bond and fix the first adhesive layer, the first wires, the at least one solar cell of the N solar cells and the second adhesive layer. In this way, the solar cells are directly electrically connected through the first wires, and the interconnection between the solar cells may be realized without a prefabricated flexible electrical connection layer, so there is no need to adopt the production equipment of flexible electrical connection layer. In addition, since there is no need to use the welding interconnection technology, the adverse effects of high welding temperature and welding stress on the solar cell string may be avoided. Furthermore, after the pressing treatment, the first adhesive layer and the second adhesive layer may bond the first wires, so that the first wires are fixed on the surface of the solar cells. Therefore, the performance of the solar cell string can be improved, the production process of the solar cell string can be simplified, and the production cost can be reduced.

The embodiments of the present disclosure will be described in detail below with reference to the accompanying drawings in order to make the objectives, technical solutions and advantages of the present invention clearer. However, it will be understood by those skilled in the art that, in the various embodiments of the present invention, numerous technical details are set forth in order to provide the reader with a better understanding of the present disclosure. However, the technical solutions claimed in the present disclosure can be implemented without these technical details and various changes and modifications based on the following embodiments.

Some embodiments of the present disclosure provide a method for manufacturing a solar cell string. FIGS. 3 to 11 are schematic structural diagrams corresponding to each step in the method for manufacturing a solar cell string. The following will be described in detail with reference to the accompanying drawings.

Figure 3:
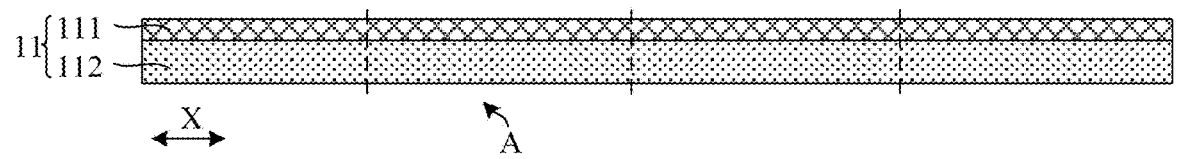
FIGS. 3 to 11 are schematic structural diagrams corresponding to each step in a method for manufacturing a solar cell string according to an embodiment of the present disclosure.

Referring to FIG. 3, a first adhesive layer 11 is provided. The first adhesive layer 11 includes N placement regions A sequentially arranged along a first direction X, each of the placement region A is used to bond and fix a corresponding solar cell, and the N is a positive integer greater than 1.

The first adhesive layer 11 is used to place N solar cells, and each of the solar cells is located on a corresponding placement region A.

In an embodiment, the first adhesive layer 11 is hot melt adhesive, and the subsequent pressing treatment includes a heating treatment. Since the hot melt adhesive has good thermal bonding performance and thermal stability, under certain temperature conditions, the hot melt adhesive may tightly bond the first wires, head wires and tail wires that may be laid later on the solar cell, so as to form an integrated structure. Further, the electrical connection effect of the first wires, the head wires, and the tail wires with the solar cells in the subsequent lamination treatment is good.

In an embodiment, the material of the first adhesive layer 11 may be any of silicone resin, epoxy resin, polyurethane, acrylic acid, ionomer, polyethylene terephthalate, polyvinyl chloride, polycarbonate and ethylene-vinyl acetate and any combination with hot melting properties.

In an embodiment, the first adhesive layer may be a UV (Ultraviolet) curing adhesive, and the subsequent pressing treatment includes an ultraviolet irradiation treatment. Under the irradiation of ultraviolet light, the first adhesive layer is cured and may tightly bonds the solar cells with the first wires, the head wires and the tail wires.

In an embodiment, the material of the first adhesive layer may be any of silicone resin, epoxy resin, polyurethane, acrylic acid, polyvinyl butyral and polycarbonate and any combination thereof with UV curing properties.

In an embodiment, the first adhesive layer 11 has a double-layer structure, and includes an adhesive layer 111 and a supporting layer 112 stacked in sequence, and the adhesive layer 111 is located between the supporting layer 112 and the solar cell to be subsequently disposed.

The adhesive layer 111 has good ductility and adhesiveness, and may improve the effect of adhesion. The material of the adhesive layer 111 may be the above-mentioned hot melt adhesive or UV curing adhesive. The supporting layer 112 has good thermal stability. In the subsequent pressing treatment, the supporting layer 112 may protect the adhesive layer 111 and further improve the effect of adhesion. The material of the supporting layer 112 may be any of polyethylene terephthalate, polyvinyl chloride, polycarbonate, nylon, any combination thereof and other materials.

The first adhesive layer 11 has a total thickness of 0.1 mm to 0.4 mm in the direction vertical to the first adhesive layer, for example, 0.15 mm, 0.2 mm, and 0.3 mm. When the total thickness of the first adhesive layer 11 is within the above range, the total thickness of the solar cell string may be kept within a small value range, and the first adhesive layer 11 has sufficient mechanical strength to avoid damage to the first adhesive layer 11. In some embodiments, the thickness of the adhesive layer 111 may be 50 μm to 300 μm, such as 100 μm, 150 μm, or 200 μm; the thickness of the support layer 112 may be 50 μm to 300 μm, such as 100 μm, 150 μm, or 200 μm.

When laying the first adhesive layer 11, the adhesive layer 111 shall face to the solar cells, and the support layer 112 shall face away from the solar cells.

In the first direction X, the length of the first adhesive layer 11 is approximately equal to the length of the solar cell string to be prepared. When the difference between the length of the first adhesive layer 11 and the length of the solar cell string is small, the contact region between the first adhesive layer 11 and the solar cells may be increased, thereby improving the firmness of the adhesion. Further, in the first direction X, the absolute value of the difference between the total length of the N solar cells and the length of the first adhesive layer 11 is less than or equal to 100 mm. It is understandable that in the first direction X, the total length of the N solar cells may be greater than, equal to, or less than the length of the first adhesive layer 11.

In an embodiment, in order to facilitate the preparation of the solar cell string, a laying platform may be provided. The first adhesive layer 11 is provided on the laying platform, and a release film is provided between the laying platform and the first adhesive layer 11. After the solar cell string is formed, the release film is removed. The release film is used to isolate the laying platform from the first adhesive layer 11 to prevent the first adhesive layer 11 from adhering to the laying platform.

In an embodiment, the operating temperature of the release film is 120 to 300° C., the release force of the release film is 5 G to 50 G, and the thickness of the release film is 25 μm to 300 μm. The release film may be single-sided or double-sided release film that has polyethylene, polyethylene terephthalate, stretchable polypropylene, biaxially stretched polypropylene film, polyvinyl chloride, polycarbonate or polyvinyl or any combination thereof as base material.

Figure 4:
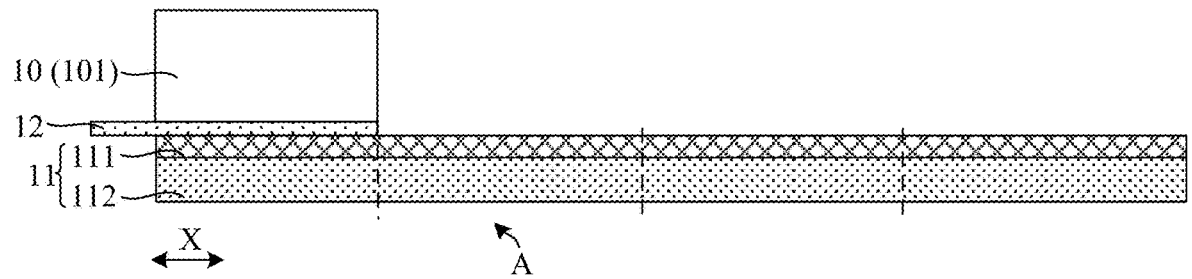

Referring to FIG. 4, a solar cell 10 is placed on a placement region A.

In an embodiment, the solar cell 10 is an N-type solar cell, such as a full-back electrode contact solar cell, a heterojunction solar cell, or a passivated contact solar cell. In other embodiments, the solar cell may be a P-type solar cell. The foregoing solar cell types are only examples, and this embodiment does not limit the specific types of solar cells.

In an embodiment, the solar cell 10 is a single solar cell. In other embodiments, the solar cell may include several slices, e.g., any of 2-12 slices.

The surface of the solar cell 10 has at least one layer of electrically conductive anti-reflection optically transparent film (not shown) and/or at least one layer of insulating anti-reflection optically transparent film (not shown), to reduce the reflectivity of light.

The solar cell 10 is firstly placed in the first placement region A, that is, the solar cell string includes the first solar cell 101 at the head portion.

Before placing the first solar cell 101, the head wires 12 are laid on the first adhesive layer 11. The head wires 12 are located between the first adhesive layer 11 and the first solar cell 101, and the head wires 12 extend outside the first solar cell 101.

In an embodiment, the laying method of the head wires 12 is as follows: using a clamp to fix head portions of the head wires 12, and the fixed head portions are located outside the first adhesive layer 11; using a guide rail to lay the head wires 12 in parallel on the first adhesive layer 11; fixing tail portions of the head wires 12 by using a clamp when the guide rail pulls the tail portions of the head wires 12 to the tail portion of the first placement region A. In this way, the head wires 12 can be arranged on the first adhesive layer 11 in parallel and uniformly.

Later, a bus bar may be used. The bus bar is contacted and connected with the heads portions of the head wires outside the first solar cell 101, so as to collect the electrical current of the solar cell string. That is, the head wires 12 extend outside the first adhesive layer 11. Compared with the case where a prefabricated flexible electrical connection layer is used, this embodiment does not require special treatment on the head portion of the first adhesive layer 11 and the head wires 12. The exposed head wires 12 may be directly connected with the bus bar, thus simplifying the production process and reducing the production cost.

In an embodiment, in the first direction X, an absolute value of a difference between the length of the head wire 12 and the length of the solar cell 10 is less than or equal to 20 mm. Since the length of the head wire 12 is close to the length of the solar cell 10, the head wires 12 have a large contact region with the solar cell 10, so that the head wires 12 may fully collect the electrical current generated by the solar cell 10.

The shape and material of the head wire 12 are similar to the shape and material of the first wire laid later. More details may be referred to in the detailed description of the first wire below.

Figure 5:
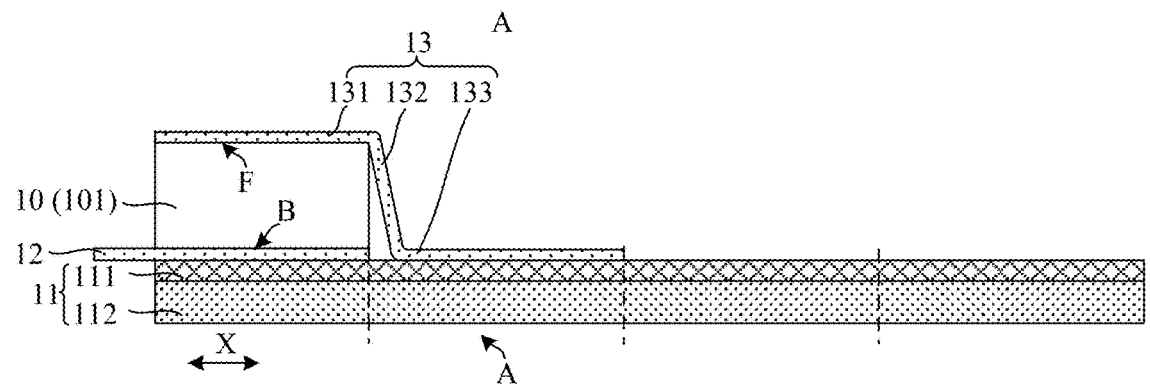

Referring to FIG. 5, first wires 13 are laid on a surface of the first solar cell 101 away from the first adhesive layer 11. The first wire 13 stretches across the adjacent placement regions A to electrically connect the two adjacent solar cells 10.

In this embodiment, the light-receiving surface F of each solar cell 10 faces the same direction, that is, in the figures, all light-receiving surfaces F face upwards, and all rear surfaces B face downwards.

The first wire 13 will be described in detail below.

The first wire 13 includes a light-receiving wire 131, a connecting wire 132, and a rear wire 133 that are sequentially connected. The method for laying the first wires 13 includes: laying the light-receiving wires 131 on the light-receiving surface F of the solar cell 10, where the light-receiving surface F is away (i.e., facing away) from the first adhesive layer 11; bending the connecting wires 132 so that the rear wires 133 are located on the surface of the first adhesive layer 11 of the adjacent placement region A.

In an embodiment, the light-receiving wires 131 are dense grid lines, that is, the light-receiving wires 131 are used as the main grid lines of the solar cell 10. Compared with the method of forming the main grid lines by screen printing, the light-receiving wire s131 serving as the main grid lines may increase the light-receiving region of the solar cell and reduce the series resistance. In other embodiments, the light-receiving wires may be used as connecting lines (rather than the main grid lines) and connect the main grid lines of the previous solar cell and the rear surface of the subsequent solar cell.

Figure 6:
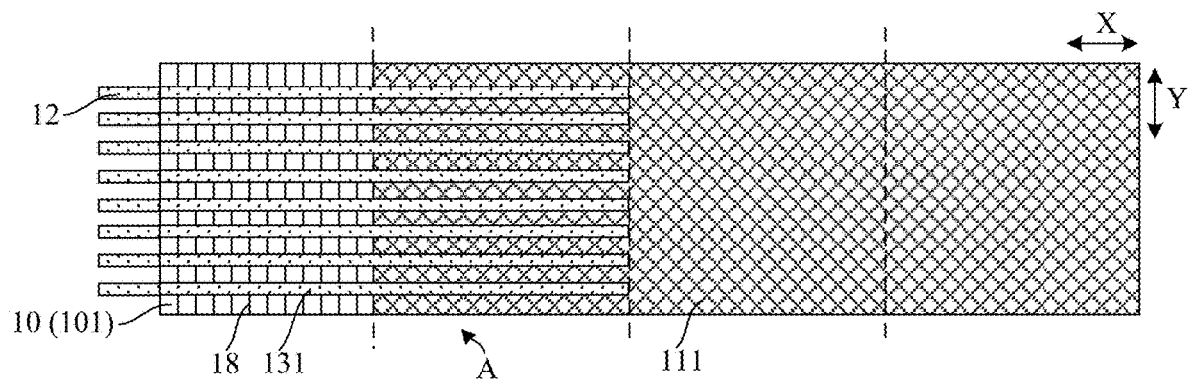

Referring to FIGS. 5 and 6 (FIG. 6 is a top view of FIG. 5), the light-receiving surface F has a plurality of subgrid lines 18 arranged at intervals, and the plurality of subgrid lines 18 intersect and contact with the dense grid lines.

For each solar cell 10, the light-receiving surface F is laid with 8 to 32 light-receiving wires 131 at intervals. Due to the large number of light-receiving wires 131, the current transmission path in the solar cell 10 may be shortened, and the internal loss may be reduced.

The absolute value of the difference between the length of the first wire 13 and twice the length of the solar cell 10 is less than or equal to 40 mm. Since the length of the first wire 13 is close to a total length of two solar cells 10, the first wires 13 has a large contact region with the solar cells 10, so that the first wires 13 may fully collect the electrical current generated by the solar cells 10.

Figure 7:
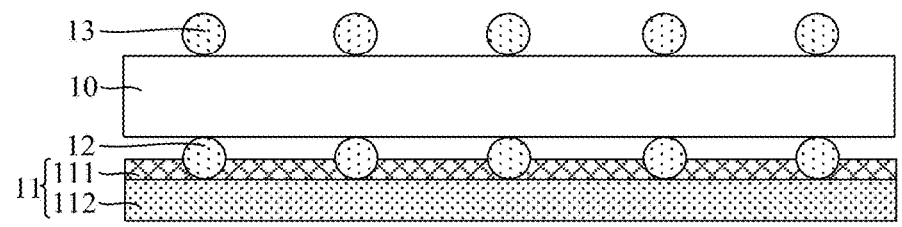

Referring to FIGS. 5 to 7, FIG. 7 is a cross-sectional view of FIGS. 5 and 6 in a second direction Y, and the second direction Y is perpendicular to the first direction X. In an embodiment, the cross section of the first wire 13 is circular, and the sectional area of the first wire 13 is 0.02 mm$^2$~0.15 mm$^2$. In other embodiments, the cross section of the first wire may be any one of square, triangle, trapezoid, and rectangle.

In an embodiment, the first wire 13 includes a solder core and an alloy layer surrounding the solder core. The material of the alloy layer is low melting point metal, so that the first wires 13 are electrically and physically connected to the subgrid lines 18 on the surface of the solar cell 10 in the subsequent lamination treatment. In an embodiment, a melting point temperature of the alloy layer is less than or equal to the process temperature of the subsequent lamination treatment. In an example, the melting point temperature of the alloy layer may be 100° C. to 160° C. The material of the alloy layer may be any of Sn, Pb, Bi, In, Zn, Cu, Sb, and Ag and any combination thereof.

In other embodiments, a first conductive layer (the first wires) may be of a single-layer structure.

Figure 8:
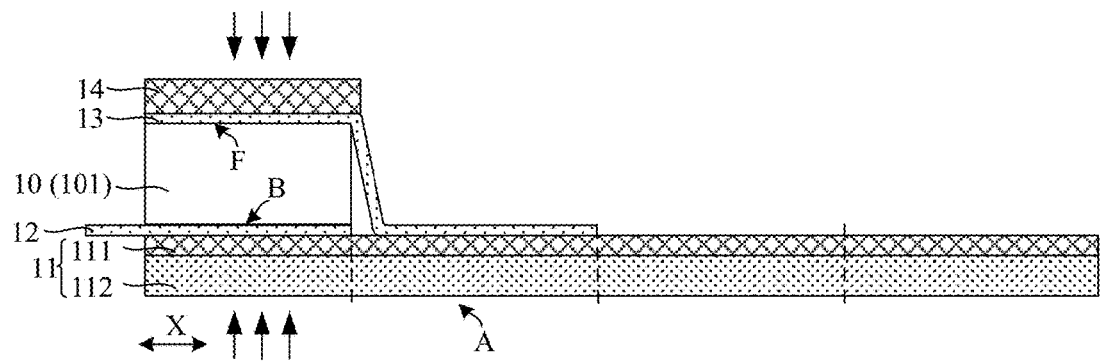

Referring to FIG. 8, a second adhesive layer 14 is disposed on the surface of the solar cell 10 away from the first adhesive layer 11, and the first wires 13 are located between the second adhesive layer 14 and the solar cell 10.

The second adhesive layer 14 is used to bond the first wires 13 and the solar cell 10. In an embodiment, since the surface of the solar cell 10 also has subgrid lines 18 (as shown in FIG. 6), the second adhesive layer 14 is located on the surface of the subgrid lines 18 in addition to the surface of the first wires 11.

The second adhesive layer 14 on the surface of the solar cell 10 may either be a piece of film, or separate films to ensure that each film covers a corresponding first wire 13. The separate films are conductive to reducing the region where the second adhesive layer 14 blocks the light-receiving surface of the solar cell 10, thereby further improving the light absorption capacity of the solar cell 10.

In an embodiment, the second adhesive layer 14 is hot melt adhesive, and the subsequent pressing treatment includes a heating treatment. In other embodiments, the second adhesive layer is a UV curable adhesive, and the subsequent pressing treatment includes an ultraviolet irradiation treatment. The material of the second adhesive layer 14 is the same as the material of the first adhesive layer 11, and more details can be referred to the relevant description of the first adhesive layer 11, which will not be repeated here.

In an embodiment, the second adhesive layer 14 is of a single-layer structure, that is, the second adhesive layer 14 is an adhesive layer. Compared with a double-layer structure, the second adhesive layer 14 with the single-layer structure may increase the light transmittance to increase the light absorption rate of the solar cell 10. In addition, the second adhesive layer 14 with the single-layer structure is lighter and thinner, which can reduce the thickness and weight of the solar cell string. In other embodiments, the second adhesive layer may be of a double-layer structure.

The material properties of the second adhesive layer 14 may be the same as the material properties of the first adhesive layer 11, that is, both are hot melt adhesive or both are UV curing adhesive. In this way, the material properties of the first adhesive layer 11 and the second adhesive layer 14 may be changed simultaneously in the same pressing treatment, so that the first adhesive layer 11 and the second adhesive layer 14 have adhesive properties.

The second adhesive layer 14 has a thickness of 0.1 mm to 0.4 mm in a direction vertical to the second adhesive layer (e.g., in a direction vertical to the first direction X), for example, 0.2 mm, 0.25 mm, or 0.3 mm. When the thickness of the second adhesive layer 14 is within the above range, the weight and thickness of the solar cell string may be kept within a small value range, and a large adhesive force may be provided.

In the first direction X, the absolute value of the difference between the length of the second adhesive layer 14 and the length of the solar cell 10 is less than or equal to 60 mm. When the difference between the length of the second adhesive layer 14 and the length of the solar cell 10 is small, the contact region between the second adhesive layer 14 and the solar cell 10 may be increased, thereby improving the firmness of adhesion.

The pressing treatment is performed to fix the first adhesive layer 11, the first wires 13, the head wires 12, the solar cell 10, and the second adhesive layer 14. In an embodiment, the surface of the first adhesive layer 11 and the surface of the second adhesive layer 14 are applied with a certain pressure, and the first adhesive layer 11, the first wires 13, the head wires 12, the solar cell 10, and the second adhesive layer 14 are tightly bonded through specific conditions such as heating treatment or ultraviolet radiation treatment to form an integrated structure.

In an embodiment, the material of the first adhesive layer 11 and the second adhesive layer 14 is hot melt adhesive, correspondingly, the pressing treatment includes a heating treatment. In an embodiment, the material of the first adhesive layer and the second adhesive layer is UV curable adhesive, correspondingly, the pressing treatment includes an ultraviolet irradiation treatment. In an embodiment, the material of the first adhesive layer and the second adhesive layer is a composite material of hot melt adhesive and UV curing adhesive, and correspondingly, the pressing treatment includes the heating treatment and the ultraviolet radiation treatment.

Figure 9:
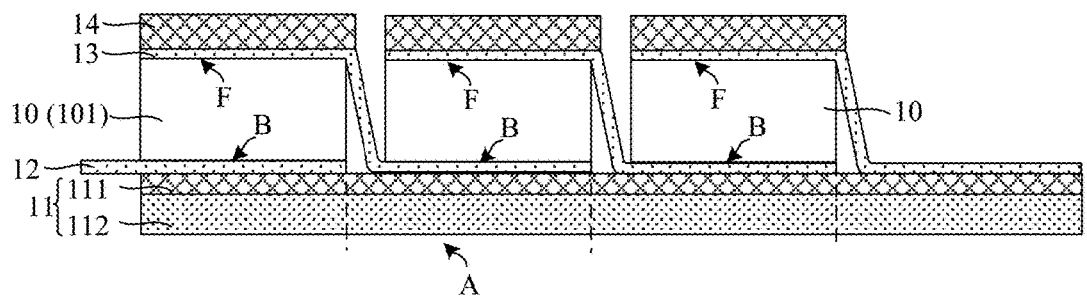

Referring to FIG. 9, the steps of placing the solar cell 10, laying the first wires 13, disposing the second adhesive layer 14 and performing the pressing treatment are repeated until the first wires 13 are laid on the placement region A at the tail portion of the solar cell string.

Figure 10:
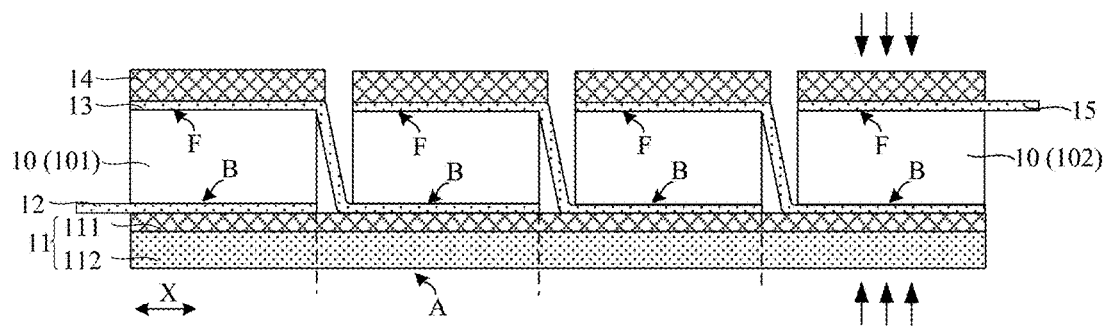

Referring to FIG. 10, the Nth solar cell 102 is placed on the placement region A at the tail portion of the solar cell string, that is, the solar cell string includes the Nth solar cell 102 at the tail portion.

After placing the Nth solar cell 102, tail wires 15 are laid on the surface of the Nth solar cell 102 away from the first adhesive layer 11, and the tail wires 15 extend outside the Nth solar cell 102. The tail wires 15 are arranged in parallel on the upper surface of the Nth solar cell 102.

Further, a second adhesive layer 14 is disposed on the surface of the Nth solar cell 102 away from the first adhesive layer 11. The detailed description of the second adhesive layer 14 may be referred to the aforementioned corresponding description, and will not be repeated here.

The pressing treatment is performed. The Nth solar cell 102, the first adhesive layer 11, the first wires 13, the tail wires 15, and the second adhesive layer 14 are fixed under certain pressure conditions and through specific conditions such as heating treatment or ultraviolet radiation treatment.

In an embodiment, after laying a solar cell 10, a lamination treatment is performed, and the number of lamination treatments is the same as the number of solar cells 10, so that the position of the head wires 12, the tail wires 15 and the first wires 13 can be relatively fixed with the solar cell 10, and the laying of the latter solar cell 10 may not change the relative position of the former solar cell 10 and the aforementioned wires.

In an embodiment, a lamination treatment may be performed after all the solar cells are laid. In an embodiment, a lamination treatment may be performed after two adjacent solar cells are laid, and thus the number of lamination treatments is equal to one-half of the number of solar cells.

Later, a bus bar is used to contact and connect with the tail wires 15 extending outside the Nth solar cell 102, so as to collect the electrical current of the solar cell string. Since the tail wires 15 extend outside the second adhesive layer 14, compared to the case where a prefabricated flexible electrical connection layer is used, this embodiment does not require special treatment on the second adhesive layer 14 located at the tail portion of the solar cell string and the tail wires 15, and the exposed tail wires 15 may be directly connected to the bus bar subsequently, thus simplifying the production process and reducing the production cost.

Figure 11:
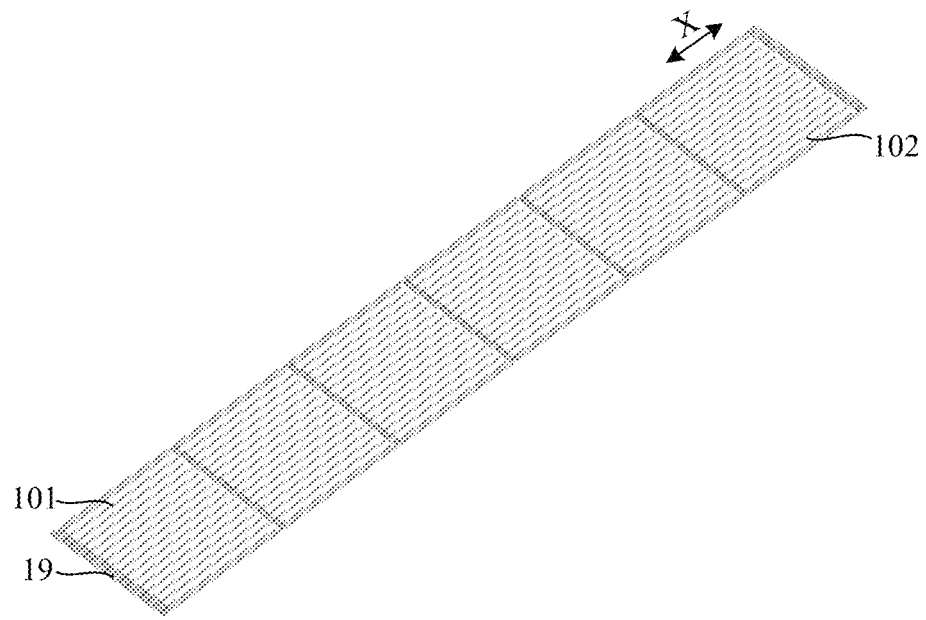

Referring to FIG. 11, at least two bus bars 19 are provided. One bus bar 19 is contacted or connected with the head wires 12 (refer to FIG. 10) extending outside the first solar cell 101, and the other bus bar 19 is contacted or connected with the tail wires 15 (refer to FIG. 10) extending outside the Nth solar cell 102. The extending directions of the bus bars 19 are different from the first direction X.

That is, one bus bar 19 is connected with all the head wires 12, and the other bus bar 19 is connected with all the tail wires 15, so as to realize the collection of the electrical current in the solar cell string.

In an embodiment, the connection between the head wires 12, the tail wires 15 and the bus bars 19 is achieved by lamination. In other embodiments, the connection between the head wires, the tail wires and the bus bars may be achieved by welding.

To sum up, the first wires 13, the head wires 12 and the tail wires 15 are directly electrically connected to the solar cells 10, and the interconnection among the solar cells 10 is realized without a prefabricated flexible electrical connection layer. Therefore, the difficulty of equipment development may be significantly reduced. Further, the methods can be realized on the basis of an existing stringer by adding a conveying mechanism for the first adhesive layer 11 and a laying mechanism for the second adhesive layer 14. Besides, in the above methods, there is no need to perform special treatment on the adhesive layer 11 at the head portion of the solar cell string and the second adhesive layer 14 at the tail portion of the solar cell string. Just the head wires 12 and the tail wires 15 are required to be exposed by extending the head wires 12 and the tail wires 15 outside the solar cell 10. In addition, in the above methods, the electrical connection between the first wires 13 and the solar cells 10 may be realized without welding, so adverse effects of high welding temperature and welding stress on the solar cells 10 may be avoided. Further, every time a solar cell 10 is laid, a lamination treatment is performed, so that the first wires 13 and the solar cell 10 may be hold in relatively fixed positions. Therefore, the above methods may simplify the production process, reduce the production cost, and improve the performance of the solar cell string.

Figure 12:
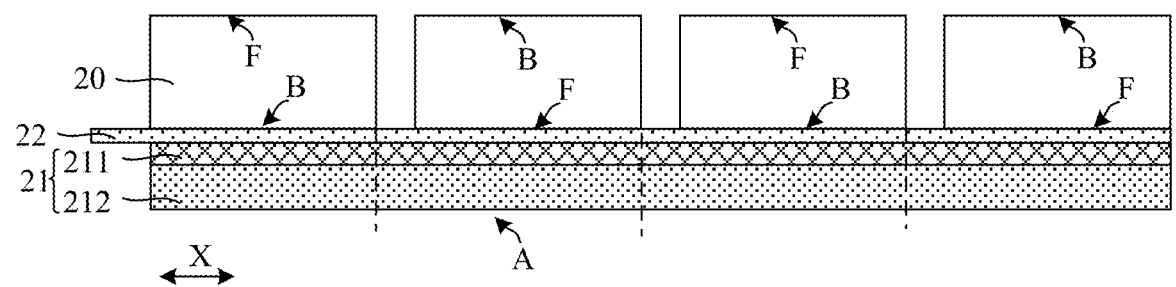
FIGS. 12 to 13 are schematic structural diagrams corresponding to each step in a method for manufacturing a solar cell string according to another embodiment of the present disclosure.
Figure 13:
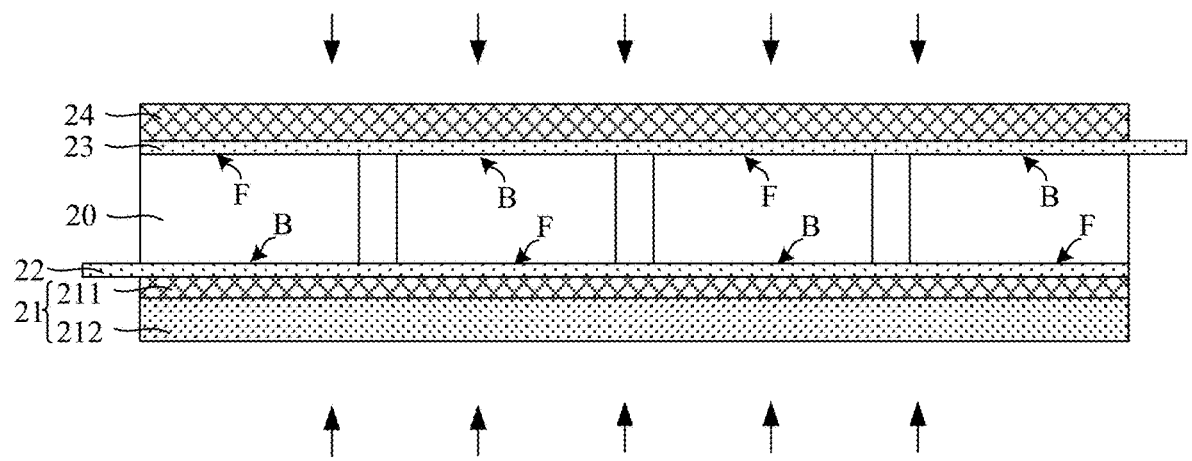

Some embodiments of the present disclosure further provide another method for manufacturing a solar cell string. This embodiment is roughly the same as the previous embodiments. The main difference is that the light-receiving surfaces of adjacent solar cells in latter embodiments face opposite directions, so that the laying method for the first wires and the second adhesive layer is different from that of the previous embodiments. FIGS. 12 and 13 are schematic structural diagrams corresponding to each step in the manufacturing method provided by latter embodiments, which will be described in detail below with reference to the accompanying drawings.

Referring to FIG. 12, a first adhesive layer 21 is provided. The first adhesive layer 21 includes N placement regions A sequentially arranged along the first direction X, and each placement region A is used to bond and fix a corresponding solar cell 20, and the N is a positive integer greater than 1.

In an embodiment, the first adhesive layer 21 is of a double-layer structure including an adhesive layer 211 and a supporting layer 212. In other embodiments, the first adhesive layer may be of a single-layer structure.

The detailed description of the first adhesive layer 21 and the solar cell 20 may be referred to the previous embodiment, which will not be repeated here.

Solar cells 20 are placed on placement regions A. All the solar cells 20 are laid, and the light-receiving surfaces F of adjacent solar cells 20 face opposite directions. That is, for the adjacent solar cells 20, the light-receiving surface F of one solar cell 20 faces upward, and a rear surface B of the next solar cell 20 faces upward.

Before placing the solar cells 20 on the placement region A, second wires 22 are laid on the surface of the first adhesive layer 21, and the second wires 22 stretch across the adjacent placement regions A to electrically connect two adjacent solar cells 20.

In an embodiment, the second wires 22 are also electrically connected to all the solar cells 20 of the solar cell string.

In an embodiment, the second wires 22 located at the head portion of the solar cell string extend outside the solar cell 20, and further electrically connect to a bus bar to collect the electrical current in the solar cell string. In other embodiments, the second wires at the tail portion of the solar cell string extend outside the solar cell and are electrically connected to the bus bar.

Since the second wires 22 extending outside the solar cell 20 are exposed to the first adhesive layer 21, there is no need to perform special treatment on the first adhesive layer 21 to expose the second wires 22, thereby simplifying the production process.

Referring to FIG. 13, first wires 23 are laid on the surface of the solar cell 20 away from the first adhesive layer 21. The first wires 23 stretch across the adjacent placement region A (refer to FIG. 12) to electrically connect two adjacent solar cells 20.

In an embodiment, the first wires 23 are electrically connected to all the solar cells 20.

The first wires 23 at the tail portion of the solar cell string extend outside the solar cell 20, and are further electrically connected to the bus bar to collect the electrical current in the solar cell string. In other embodiments, the second wires at the head portion of the solar cell string extend outside the solar cell and are electrically connected to the bus bar.

Further, a second adhesive layer 24 is disposed on the surface of the solar cells 20 away from the first adhesive layer 21, and the first wires 23 are located between the second adhesive layer 24 and the solar cells 20.

The pressing treatment is performed to bond and fix the first adhesive layer 21, the first wires 23, the second wires 22, the solar cells 20, and the second adhesive layer 24. The pressing treatment may be performed to tightly bond the above-mentioned structures through specific conditions such as pressure, high temperature, or ultraviolet radiation to form an integrated structure.

The light-receiving surfaces of adjacent solar cells 20 face different directions, so there is no need to bend the first wires 23. A single first wire 23 may connect all the solar cells 20, and a single second wire 22 may also connect all the solar cells 20, and there is no need to additionally provide head wires and tail wires. In addition, the lamination treatment may be performed after all the solar cells 20 are laid, thus reducing the frequency of laminations and improving production efficiency. Therefore, the production process is simplified and the production cost is reduced.

Some embodiments of the present disclosure also provide a solar cell string which may be manufactured by the manufacturing methods provided in the foregoing embodiment. FIGS. 10 and 11 are schematic diagrams of the solar cell string as provided.

Referring to FIGS. 10 and 11, the solar cell string includes: a first adhesive layer 11, N solar cells 10, first wires 13 and second adhesive layers 14. The first adhesive layer 11 includes N placement regions A sequentially arranged along a first direction X, and the N is a positive integer greater than 1. Each of the solar cells 10 is disposed on a corresponding placement region A. The first wires 13 are laid on a surface of the solar cell 10 away from the first adhesive layer 11, and the first wires 13 stretch across the adjacent placement region A to electrically connect two adjacent solar cells 10. The second adhesive layers 14 are respectively disposed on the surfaces of the solar cells 10 away from the first adhesive layer 11. The first wires 13 are located between the second adhesive layer 14 and the solar cell 10. The first adhesive layer 11, the first wires 13, the solar cells 10 and the second adhesive layers 14 are bonded and fixed.

A detailed description will be given below with reference to the accompanying drawings.

Referring to FIG. 10, in an embodiment, the light-receiving surfaces F of the solar cells 10 in the solar cell string face the same direction, that is, all the light-receiving surfaces F face upward (in a direction away from the first adhesive layer 11), and all the rear surfaces B face downward. The solar cell string includes a first solar cell 101 at a head portion and an N-th solar cell 102 at a tail portion respectively. Detailed description of the solar cell 10 may be referred to the description of the foregoing embodiments, which will not be repeated here.

The first wires 13 are used to electrically connect two adjacent solar cells 10. In an embodiment, each first wire 13 includes a light-receiving wire, a connecting wire, and a rear wire that are sequentially connected. The light-receiving wire is located on the light-receiving surface F of a solar cell 10, the rear wire is located on the rear surface B of a next solar cell 10, and the connecting wire is located between the adjacent solar cells 10.

The solar cell string further includes: head wires 12 located between the first adhesive layer 11 and the first solar cell 101 and extending outside the first solar cell 101. The head wires 12 extend outside the first solar cell 101 and are exposed to the first adhesive layer 11.

The solar cell string further includes: tail wires 15 located on the surface of the Nth solar cell 102 away from the first adhesive layer 11 and extending outside the Nth solar cell 102. The second adhesive layer 14 is disposed on the surface of the Nth solar cell 102 away from the first adhesive layer 11. The tail wires 15 extend outside the Nth solar cell 102 and are exposed to the second adhesive layer 14.

Referring to FIGS. 10 and 11, the solar cell string further includes at least two bus bars 19. One of the bus bars 19 is contacted and connected with the head wires 12 extending outside the first solar cell 101, the other bus bar 19 is contacted and connected with the tail wire 15 extending outside the Nth solar cell to contact and connect, and the extend directions of the bus bars 19 are different from the first direction X.

Detailed descriptions of the first wire 13, the head wire 12 and the tail wire 15 may be referred to the foregoing embodiments, which will not be repeated here.

As shown in FIG. 10, the first adhesive layer 11 is used to bond and fix all the solar cells 10 of the solar cell string. In the first direction X, the length of the first adhesive layer 11 is approximately equal to the length of the solar cell string to be prepared. When the difference between the length of the first adhesive layer 11 and the length of the solar cell string 10 is small, the contact region between the first adhesive layer 11 and the solar cells 10 may be increased, thereby improving the firmness of adhesion. Further, in the first direction X, the absolute value of the difference between the total length of the N solar cells 10 and the length of the first adhesive layer 11 is less than or equal to 100 mm.

The first adhesive layer 11 is also used to bond and fix the first wires 13 and the head wires 12 on the surface of the solar cell 10 to ensure that the wires are uniformly arranged, so that the wires may fully collect the electrical current generated in the solar cell 10.

The first adhesive layer 11 includes a supporting layer 112 and an adhesive layer 111, and the adhesive layer 111 is located between the supporting layer 112 and the solar cells 10. Detailed descriptions of the supporting layer 112 and the adhesive layer 111 may be referred to the foregoing embodiments.

An individual second adhesive layer 14 corresponds to a solar cell 10 for fixing the first wires 13 or the tail wires 15 on the surface of the solar cell 10.

In the first direction X, the absolute value of the difference between the length of the second adhesive layer 14 and the length of the corresponding solar cell 10 is less than or equal to 60 mm. When the difference between the length of the second adhesive layer 14 and the length of the corresponding solar cell 10 is small, the contact region between the second adhesive layer 14 and the corresponding solar cell 10 may be increased, thereby improving the firmness of adhesion.

In an embodiment, the second adhesive layer 14 has a single-layer structure. Compared with a double-layer structure, the single-layer structure has better light transmittance and may increase the light absorption rate of the solar cell 10.

In an embodiment, the second adhesive layer 14 is a piece of film for an individual solar cell 10. That is, the second adhesive layer 14 not only covers the surface of the solar cell 10 corresponding to the first wires, but also covers the surface of the solar cell 10 between adjacent first wires 13. In this way, the coverage region of the second adhesive layer 14 may be increased, so as to increase the firmness of adhesion and prevent the first wires 13 from shifting.

In an embodiment, there are a plurality of first wires and the second adhesive layer has discrete film structures for an individual solar cell. That is, each discrete film structure is provided above the corresponding first wire. In other words, the second adhesive layer only covers the surface of the solar cell corresponding to the first wire, and the second adhesive layer does not cover the surface of the solar cell between adjacent first wires. The reduction of the coverage region may increase the light-absorbing ability of the solar cell.

Since the head wires 12 and the tail wires 15 are exposed to the first adhesive layer 11 and the second adhesive layer 14 respectively, there is no need to perform special treatment on the first adhesive layer 11 and the second adhesive layer 14 before respectively connecting the head wires 12 and the tail wires 15 with the bus bars 19 (refer to FIG. 11). The exposed head wires 12 and tail wires 15 may be directly connected to the bus bars 19 respectively.

In other embodiments, referring to FIG. 13, the light-receiving surfaces F of adjacent solar cells 20 in the solar cell string face different directions. That is, for adjacent solar cells 20, the light-receiving surface F of one solar cell 20 faces upward, and the light-receiving surface F of the next solar cell 20 faces downward. The first wires 23 are located on one side of all the solar cells 20 and electrically connected to all the solar cells 20. The second wires 22 are located on the other side of all the solar cells 20 and electrically connected to all the solar cells 20. The second adhesive layer 24 covers all the solar cells 20.

In summary, in the above embodiments, there is no need to perform special treatment on the first adhesive layer 11 at the head portion of the solar cell string and the second adhesive layer 14 at the tail of the solar cell string. The head wires 12 and the tail wires 15 may be exposed only by respectively extending the head wires 12 and the tail wires 15 outside the solar cell 10. In addition, in the above embodiments, the electrical connection between the first wires 13 and the solar cells 10 may be realized without welding, so that the adverse effects of high welding temperature and welding stress on the solar cell 10 may be avoided.

Figure 14:
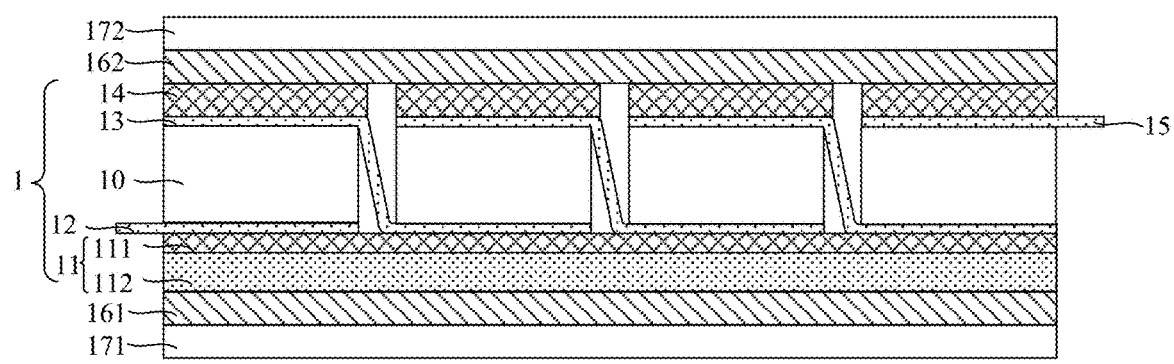
FIG. 14 is a schematic structural diagram corresponding to a method for manufacturing a photovoltaic module according to the present disclosure.

Some embodiments of the present disclosure also provide a method for manufacturing a photovoltaic module. FIG. 14 is a schematic structural diagram corresponding to a manufacturing method as provided. A detailed description will be given below with reference to the accompanying drawings.

Referring to FIG. 14, a solar cell string 1 is provided, and the solar cell string 1 is any one as provided in the foregoing embodiments. The solar cell string 1 includes solar cells 10, head wires 12, first wires 13, tail wires 15, a first adhesive layer 11, and second adhesive layers 14. The first adhesive layer 11 is of a double-layer structure including an adhesive layer 111 and a supporting layer 112. The second adhesive layer 14 is of a single-layer structure.

As shown in FIG. 14, a first substrate 171, a first encapsulating layer 161, the solar cell string 1, a second encapsulating layer 162, and a second substrate 172 are stacked in sequence to form a stacked structure.

There may be one or more solar cell strings 1. If there are multiple solar cell strings 1, a bus bar is used to electrically and physically connect the multiple solar cell strings 1. In an embodiment, the bus bar may be connected to the solar cell strings 1 by welding or hot pressing. The multiple solar cell strings 1 may be arranged in parallel.

The bus bar is made of low-resistivity material which may be any of Ag, Cu, Ti, Sn, Ni, Al, Au and any combination thereof. The cross-section of the bus bar may be any of round, square, triangle, trapezoid, and rectangle. The surface of the bus bar may be coated with a layer of alloy material with a thickness of 5-100 um. The alloy material may be any one of Sn, Pb, Bi, In, Zn, Cu, Sb, and Ag and any combination thereof.

The first substrate 171 is a flexible or rigid substrate with high light transmittance or high reflectance, and may be a single-sided or double-sided fluorine-containing back plate, toughened glass, ethylene-tetrafluoroethylene copolymer or other substrate.

The second substrate 172 is a flexible or rigid substrate with high light transmittance, and may be made of polyethylene terephthalate, tempered glass, or ethylene-tetrafluoroethylene copolymer or other materials.

The material of the first encapsulation layer 161 is any one of polyethylene-polyvinyl acetate copolymer, polyolefin, and polyvinyl butyral and any combination thereof.

The material of the second encapsulation layer 162 is any one of polyethylene-polyvinyl acetate copolymer, polyolefin, and polyvinyl butyral and any combination thereof.

The lamination treatment is performed on the stacked structure, and the first wires 13 and the solar cell 10 are electrically connected during the lamination treatment. The head wires 12 and the tail wires 15 are also electrically connected to the respective solar cell 10 during the lamination treatment. Since the interconnection process with high temperature welding is eliminated, the welding stress may be reduced in this way, thereby reducing the risk of the manufacturing process.

The lamination treatment will be described in details below.

The process temperature used in the lamination treatment is greater than or equal to the melting point temperature of the first wire 13. In this way, during the lamination treatment, the first wires 13 are melted so as to achieve electrical connection between the first wires 13 and the solar cell 10. Further, in an embodiment, the first wire 13 includes a solder core and an alloy layer surrounding the solder core, and the process temperature used in the lamination treatment is greater than or equal to the melting point temperature of the alloy layer. When the process temperature is higher than the melting point temperature of the alloy layer, the alloy layer melts, and the melted alloy layer is electrically connected to the solar cell 10 under the effect of pressure.

The alloy layer is made of low melting point metal, and has a melting point temperature of 100° C. to 160° C., for example, 120° C., 130° C., or 150° C. The material of the alloy layer may be any one of Sn, Pb, Bi, In, Zn, Cu, Sb, and Ag and any combination thereof.

In an embodiment, the difference between the process temperature of the lamination treatment and the melting point temperature is less than or equal to 30° C. In this embodiment, the melting point temperature refers to the melting point temperature of the alloy layer. When the process temperature is within the above range, the alloy layer may be fully melted, thereby improving the effect of electrical connection between the alloy layer and the solar cell 10. In addition, the risk of cracking of the solar cell string 1 at excessive high temperatures may also be reduced.

The material of the solder core is low-resistance metal, such as Ag, Cu, Ti, Sn, Ni, Al, and Au and any combination thereof. In other embodiments, the first wire may have a one-layer structure of the solder core, and the melting point temperature refers to the melting point temperature of the solder core, that is, the process temperature of the lamination treatment is greater than or equal to the melting point temperature of the solder core.

The process pressure used in the lamination treatment is −50 kPa~200 kPa. When the process pressure is within the above range, the connection strength between the first wire 13 and the solar cell 10 may be increased, and the solar cell string 1 may be prevented from being damaged by excessive pressure. In an embodiment, the process pressure is −20 kPa~150 kPa.

To sum up, the lamination treatment is adopted to realize the electrical connection between the first wires 13 and the solar cell 10, which may avoid the adverse effects of high welding temperature and welding stress on the solar cell string 1.

Some embodiments of the present disclosure also provide a photovoltaic module. The photovoltaic module as provided may be manufactured using the photovoltaic module manufacturing method provided in the previous embodiments. FIG. 14 is a schematic structural diagram of the photovoltaic module as provided.

Referring to FIG. 14, the photovoltaic module includes: a first substrate 171, a first encapsulating layer 161, a solar cell string 1 as provided in the foregoing embodiments, a second encapsulating layer 162, and a second substrate 172 stacked in sequence.

Detailed description of the photovoltaic module may be referred to as above, which will not be repeated here.

Those of ordinary skill in the art can understand that the above-mentioned embodiments are specific examples for realizing the present disclosure, and in actual applications, various changes may be made in form and details without departing from the spirit and range of the present disclosure. Any person skilled in the art can make their own changes and modifications without departing from the spirit and scope of the present disclosure. Therefore, the protection scope of the present disclosure should be subject to the scope defined by the claims.

What is claimed is:

1. A method for manufacturing a solar cell string, wherein the solar cell string comprises N solar cells sequentially arranged along a first direction and connected in series, and the method comprises:
   providing a first adhesive layer, wherein the first adhesive layer comprises N placement regions along the first direction, each of the placement regions is used to bond and fix a corresponding solar cell of the N solar cells, and the N is a positive integer greater than 1;
   placing the N solar cells on the placement regions;
   laying first wires on a surface of at least one solar cell of the N solar cells facing away from the first adhesive layer, and stretching the first wires across adjacent placement regions to electrically connect two adjacent solar cells;
   placing a second adhesive layer on the surface of the at least one solar cell of the N solar cells facing away from the first adhesive layer, wherein the first wires are partially located between the second adhesive layer and the at least one solar cell; and
   performing a pressing treatment to bond and fix the first adhesive layer, the first wires, the at least one solar cell of the N solar cells and the second adhesive layer;
   wherein light-receiving surfaces of the N solar cells face a same direction, and the first wires comprise light-receiving wires, connecting wires and rear wires that are respectively sequentially connected; wherein laying the first wires comprises:
   laying the light-receiving wires on the light-receiving surface of one of the N solar cells, wherein the light-receiving surface faces away from the first adhesive layer; and
   bending the connecting wires so that the rear wires are on a surface of the first adhesive layer of an adjacent placement region.

2. The method according to claim 1, wherein the light-receiving wires are dense grid lines, the light-receiving surface of each of the N solar cells is provided with subgrid lines arranged at intervals, and the subgrid lines intersect and contact with the dense grid lines; and the method further comprises:
   placing the second adhesive layer on surfaces of the subgrid lines.

3. The method according to claim 1, wherein 8 to 32 light-receiving wires are laid at intervals on the light-receiving surface of each of the N solar cells.

4. The method according to claim 1, wherein light-receiving surfaces of adjacent solar cells face opposite directions; the method further comprises:
   laying second wires on the surface of the first adhesive layer of the N placement regions before placing the N solar cells on the N placement regions, and stretching the second wires across adjacent placement regions to electrically connect adjacent solar cells.

5. The method according to claim 1, wherein the solar cell string comprises a first solar cell at a head portion of the solar cell string and an Nth solar cell at a tail portion of the solar cell string respectively; the method further comprises:
   laying head wires on the first adhesive layer before placing the first solar cell, wherein the head wires are located between the first adhesive layer and the first solar cell, and the head wires extend outside the first solar cell;
   laying tail wires on a surface of the Nth solar cell away from the first adhesive layer and extending the tail wires outside the Nth solar cell after placing the Nth solar cell, and disposing the second adhesive layer on the surface of the Nth solar cell away from the first adhesive layer; and
   providing at least two bus bars, wherein one of the bus bars is contacted and connected with the head wires extending outside the first solar cell, and the other bus bar is contacted and connected with the tail wires extending outside the Nth solar cell; and extend directions of the two bus bars are both different from the first direction.

6. The method according to claim 1, wherein the pressing treatment comprises at least one of:
   a heating treatment, wherein the first adhesive layer comprises a hot melt adhesive, and the second adhesive layer comprises a hot melt adhesive; and
   an ultraviolet irradiation treatment, wherein the first adhesive layer comprises a UV curable adhesive, and the second adhesive layer comprises a UV curable adhesive.

7. A method for manufacturing a photovoltaic module, comprising:
   providing a solar cell string, wherein the solar cell string comprises N solar cells sequentially arranged along a first direction and connected in series, and the solar cell string is manufactured by a method comprising:
   providing a first adhesive layer, wherein the first adhesive layer comprises N placement regions along the first direction, each of the placement regions is used to bond and fix a corresponding solar cell of the N solar cells, and the N is a positive integer greater than 1;
   placing the N solar cells on the placement regions;
   laying first wires on a surface of at least one solar cell of the N solar cells facing away from the first adhesive layer, and stretching the first wires across adjacent placement regions to electrically connect two adjacent solar cells;
   placing a second adhesive layer on the surface of the at least one solar cell of the N solar cells facing away from the first adhesive layer, wherein the first wires are partially located between the second adhesive layer and the at least one solar cell; and
   performing a pressing treatment to bond and fix the first adhesive layer, the first wires, the at least one solar cell of the N solar cells and the second adhesive layer;
   wherein light-receiving surfaces of the N solar cells face a same direction, and the first wires comprise light-receiving wires, connecting wires and rear wires that are respectively sequentially connected;
   wherein laying the first wires comprise:
   laying light-receiving wires on the light-receiving surface of one of the N solar cells, wherein the light-receiving surface faces away from the first adhesive layer; and
   bending connecting wires so that the rear wires are on a surface of the first adhesive layer of an adjacent placement region;
   stacking a first substrate, a first encapsulating layer, the solar cell string, a second encapsulating layer, and a second substrate to form a stacked structure; and
   performing a lamination treatment on the stacked structure, wherein the first wires are electrically connected with the solar cells during the lamination treatment.

8. The method according to claim 7, wherein a process temperature used in the lamination treatment is greater than or equal to a melting point temperature of the first wire.

9. The method according to claim 8, wherein the first wire comprises a solder core and an alloy layer surrounding the solder core, and the process temperature used in the lamination treatment is greater than a melting point temperature of the alloy layer.

10. The method according to claim 8, wherein a difference between the process temperature of the lamination treatment and the melting point temperature is less than or equal to 30° C.

11. The method according to claim 8, wherein a process pressure used in the lamination treatment is −50 kPa to 200 kPa.

12. The method according to claim 8, wherein the melting point temperature is 100° C. to 160° C.

* * * * *